United States Patent [19]
McPartland

[11] Patent Number: 6,157,577
[45] Date of Patent: Dec. 5, 2000

[54] MEMORY DEVICE VOLTAGE STEERING TECHNIQUE

[75] Inventor: Richard J. McPartland, Nazareth, Pa.

[73] Assignee: Lucent Technologies, Inc., Murray Hill, N.J.

[21] Appl. No.: 09/247,302

[22] Filed: Feb. 9, 1999

[51] Int. Cl.[7] .................................................. G11C 7/00
[52] U.S. Cl. ........................... 365/189.05; 365/185.25; 365/189.03; 365/185.18; 365/203; 365/204
[58] Field of Search ......................... 365/189.05, 185.25, 365/189.03, 185.18, 203, 204

[56] References Cited

U.S. PATENT DOCUMENTS

| | | | |
|---|---|---|---|
| 4,794,564 | 12/1988 | Watanabe | 365/184 |
| 5,058,063 | 10/1991 | Wada et al. | 365/185 |
| 5,450,357 | 9/1995 | Coffman | 365/189.11 |
| 5,677,872 | 10/1997 | Samachisa et al. | 365/185.14 |
| 5,790,460 | 8/1998 | Chen et al. | 365/185.29 |
| 5,835,415 | 11/1998 | Harari | 365/185.29 |

*Primary Examiner*—David Nelms
*Assistant Examiner*—Connie C. Yoha
*Attorney, Agent, or Firm*—Synnestvedt & Lechner LLP

[57] ABSTRACT

A method and associated circuitry are disclosed for applying the high column voltage needed to erase and program (write) a flash EEPROM memory. Low voltage CMOS transistors are used for both the read column precharge path and the write/erase data transfer path. This reduces precharge time, increasing the frequency at which the flash memory can be read. This also eliminates the lengthening of precharge time that occurs as the characteristics of high voltage transistors degrade with age. The present invention provides the additional advantage of eliminating the need to use less reliable high voltage transistors in certain off-pitch circuits needed for write and erase functions, thus increasing overall chip reliability.

22 Claims, 5 Drawing Sheets

(TYPICAL)

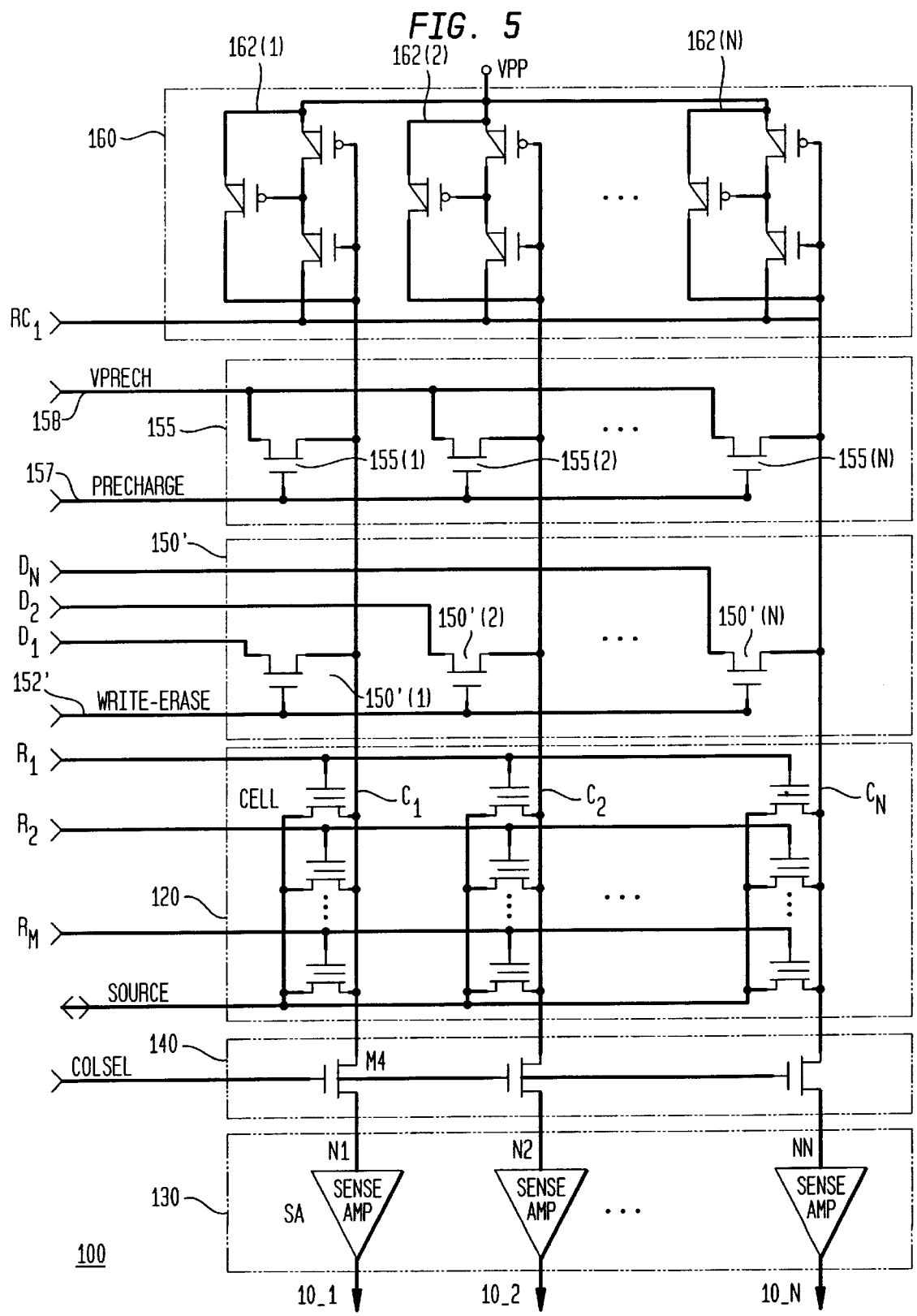

MEMORY DEVICE VOLTAGE STEERING TECHNIQUE

FIELD OF THE INVENTION

The present invention relates to flash EEPROM memory.

BACKGROUND OF THE INVENTION

As used herein, the term "high voltage" refers to voltages of nominally 5 volts or more; the term "low voltage" refers to voltages significantly less than 5 volts, being typically 3.3 volts or less. The term "high voltage transistor" refers to a transistor designed to operate with a minimum of degradation at a high voltage (e.g., a thick-oxide transistor); and the term "low voltage transistor" refers to a transistor designed to operate only at a low voltage (e.g., a low-voltage CMOS transistor).

The use of embedded flash Electronically Erasable Programmable Read Only (EEPROM) memory in cellular phones, answering machines, cordless phones and other silicon integrated circuits is increasing. Current generation flash EEPROMS require the use of circuitry and thick-oxide transistors capable of handling relatively high voltages (e.g., 5 volts and higher, typically 7 volts) for erasing and programming (writing) flash memory. These high voltage transistors are needed in the critical read column precharge path of these prior art EEPROM's because the columns must be raised to high voltages during erase and programming operations. There are drawbacks, however, to using high voltage transistors in EEPROM's; high voltage transistors operated at high voltages are subject to parameter degradation and are inherently less reliable than low voltage core CMOS transistors operated at lower voltages (e.g., less than 5 volts, typically about 3 volts or less). Thus the characteristics of high voltage transistors cannot be relied upon for successful read mode operation. Read precharge and cycle times are also increased when high voltage transistors are used in the critical read column precharge path because of their significantly lower gain (typically less than one-half the gain of low voltage core CMOS transistors).

FIG. 1 illustrates a prior art EEPROM circuit 10. In FIG. 1 a flash EEPROM memory array 20 is shown having N columns ($C_1, C_2, \ldots C_N$) and M rows ($R_1, R_2, \ldots R_M$) and an associated on-pitch sense amplifier block 30, column select transistor block 40, high voltage column precharge transistor block 50, and write/erase data transfer gate block 60. The column precharge transistor block 50 comprises thick oxide, high voltage transistors 51(1), 51(2) ..., 51(N). They must be high voltage, thick-oxide transistors to protect their gate oxides when high voltage is applied to their drains along columns $C_1$ $C_2$, and $C_N$ during erase and write operations.

As is known in the art, when erasing a flash EEPROM memory array, all columns must be raised to a high voltage, typically 7 volts, and the rows, $R_1, R_2, \ldots, R_M$, kept at ground (0 volts) or reduced to a negative potential below ground. When writing a flash EEPROM memory array 20, columns associated with cells to be written are also raised to a high potential, typically 7 volts, as is the row associated with the cells to be written to. Other columns associated with cells along the same row and not to be written to remain at ground. When erasing or writing, it is therefore necessary to raise one or more columns to high voltage levels and the transistors associated with the column precharge transistor block must be high-voltage thick oxide transistors.

With reference to the first column $C_1$ in FIG. 1, the method and circuitry of the prior art will be described. In preparation for applying high voltage to the first column $C_1$ a high voltage, typically 7 volts, is applied to the data input $D_1$ and the read control input $RC_1$ of the write/erase data transfer gate block 60. This sets up the data but blocks conduction through devices M7 and M8. The high voltage is transferred onto column C1, initiating the write or erase, by lowering the read control input $RC_1$, This turns on devices M7 and M8 passing the high voltage from data input $D_1$ onto the column. Prior to applying high voltage to these inputs ($D_1$ and $RC_1$), the precharge input must be set to ground to prevent conduction through the precharge transistor 51(1) within precharge block 50.

For those columns associated with cells not to be written but along the same row as other cells being written, their voltage is kept at ground by keeping their data inputs (i.e., $D_1, D_2, \ldots D_N$) at ground.

The column select transistor block 40 and sense amplifier block 30 are used for reading the flash memory. Care must be taken not to over-voltage stress the transistors in these blocks during write or erase. If column select transistors 41(1), 41(2) ... 41(N) in column select block 40 are low voltage transistors, their gates (COLEN input 42) must be set to VDD level (e.g. 3 volts) prior to raising the column voltage above VDD; otherwise the gate-to-drain voltage will go to a high voltage and possibly damage the transistor's gate oxide. With their gates at VDD and the columns raised high, the inputs to the sense amplifiers(s) ($N_1, N_2, \ldots, N_n$) will be VDD−Vt. This will not over-stress any transistors in the sense amplifier. Alternatively, the column select transistors 41(1), 41(2) ... 41(N) in the column select transistor block 40 could be high voltage transistors. In this case COLEN input 42 can be set at ground, blocking conduction through these devices.

During erase and write operations the gates of precharge transistors 51(1), 51(2), ... 51(N) are at ground (0 volts) along PRECHARGE input 52. This results in a high gate-to-drain potential (e.g., 7 volts) for each transistor, which is easily withstood by the high voltage transistors (but which would destroy low voltage core CMOS transistors). However, due to their low gain, use of high voltage transistors in the precharge path limits circuit performance by increasing precharge and cycle time. The characteristics of high voltage transistors also degrade over time when operated at high voltages. This degradation may lengthen precharge time during read operations.

As is well known, the write/erase data inputs $D_1, D_2, \ldots D_N$ and the read control signal input $RC_1$ of write/erase data transfer gate block 60 must be at high voltage levels when asserted to carry out the write or erase functions. Thus, off-pitch circuitry (not shown) needed to generate these signals must also include high voltage transistors. Because high voltage transistors are generally less reliable than low voltage transistors, this increased use of high voltage transistors may lead to a less reliable EEPROM.

SUMMARY OF THE INVENTION

The present invention relates to a new method, and associated circuitry, for applying the high column voltage needed to erase and program (write) a memory, particularly a flash EEPROM memory. In contrast to the low gain, thick oxide, high voltage transistors used in the read column precharge path of the prior art, the present invention utilizes low voltage transistors (and a low voltage power supply) for both the read column precharge path and the write/erase data transfer path.

According to a first aspect of the present invention, a method of controlling the application of erase and write column voltages to a flash EEPROM having an array of memory cells arranged on an integrated circuit having rows and columns, and including a CMOS read column precharge path and write/erase data transfer path, comprises the step of applying voltage signals to the read column precharge path and the write/erase data transfer path at a level lower than the erase and write column voltages and sufficient to allow the erase and write column voltages to flow along the columns. In a preferred embodiment the level of the voltage signal applied to the read column precharge and write/erase data transfer path is less than 5 volts, and more preferably approximately equal to or less than 3 volts.

According to a second aspect of the present invention, a memory device comprises a memory array which includes rows and columns; a precharge and write/erase block coupled to the column select block along the columns and to the rows, comprising one low-voltage CMOS transistor per column; and a write/erase column latch block coupled to the precharge and write/erase block along the columns.

DESCRIPTION OF THE DRAWINGS

FIG. 5 is a diagram of an alternative embodiment showing separate read column precharge and write/erase data transfer transistor blocks.

DETAILED DESCRIPTION OF THE PREFERRED EMBODIMENTS

Figure 1:
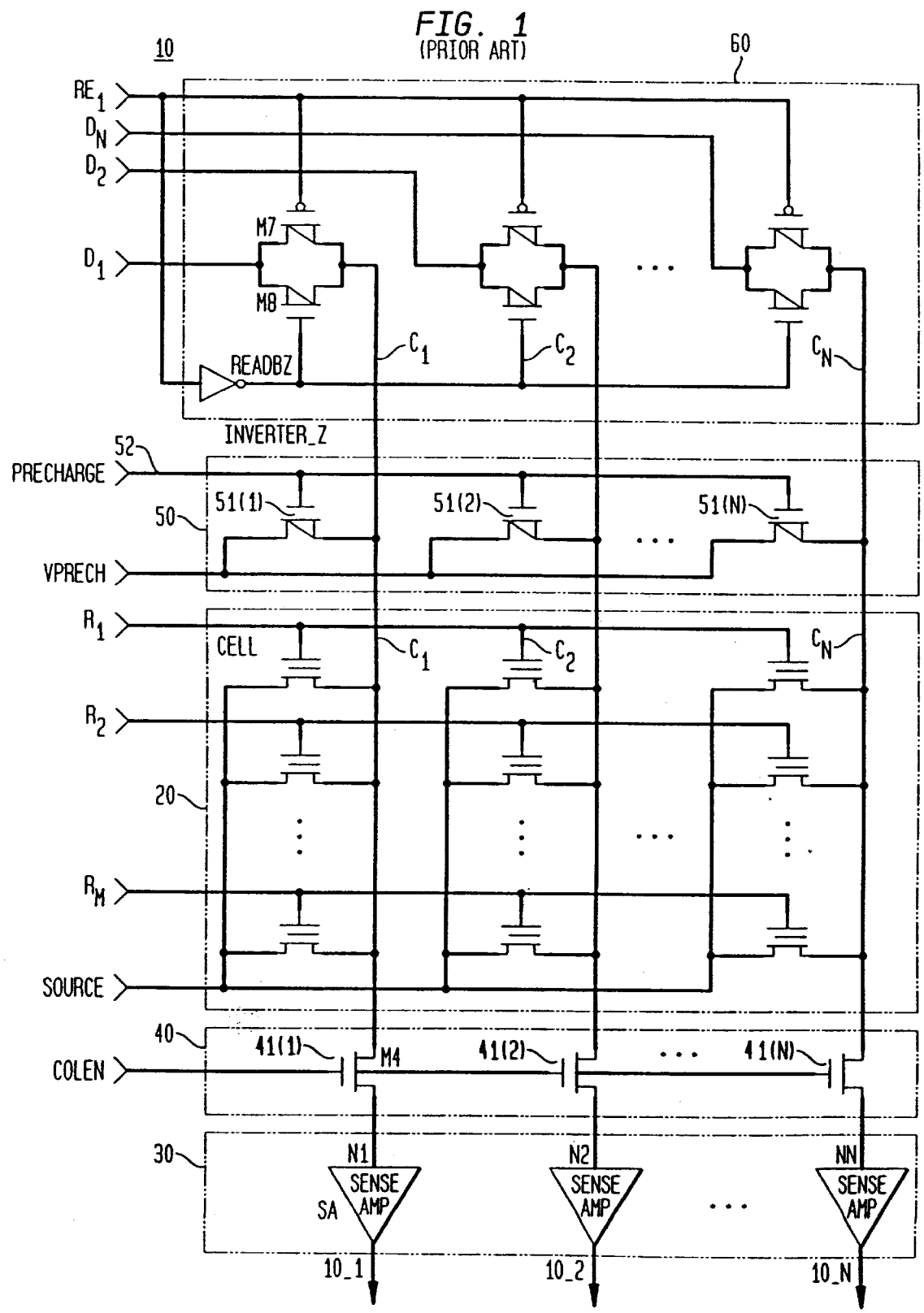
FIG. 1 is a block diagram of a prior art flash EEPROM.
Figure 2:
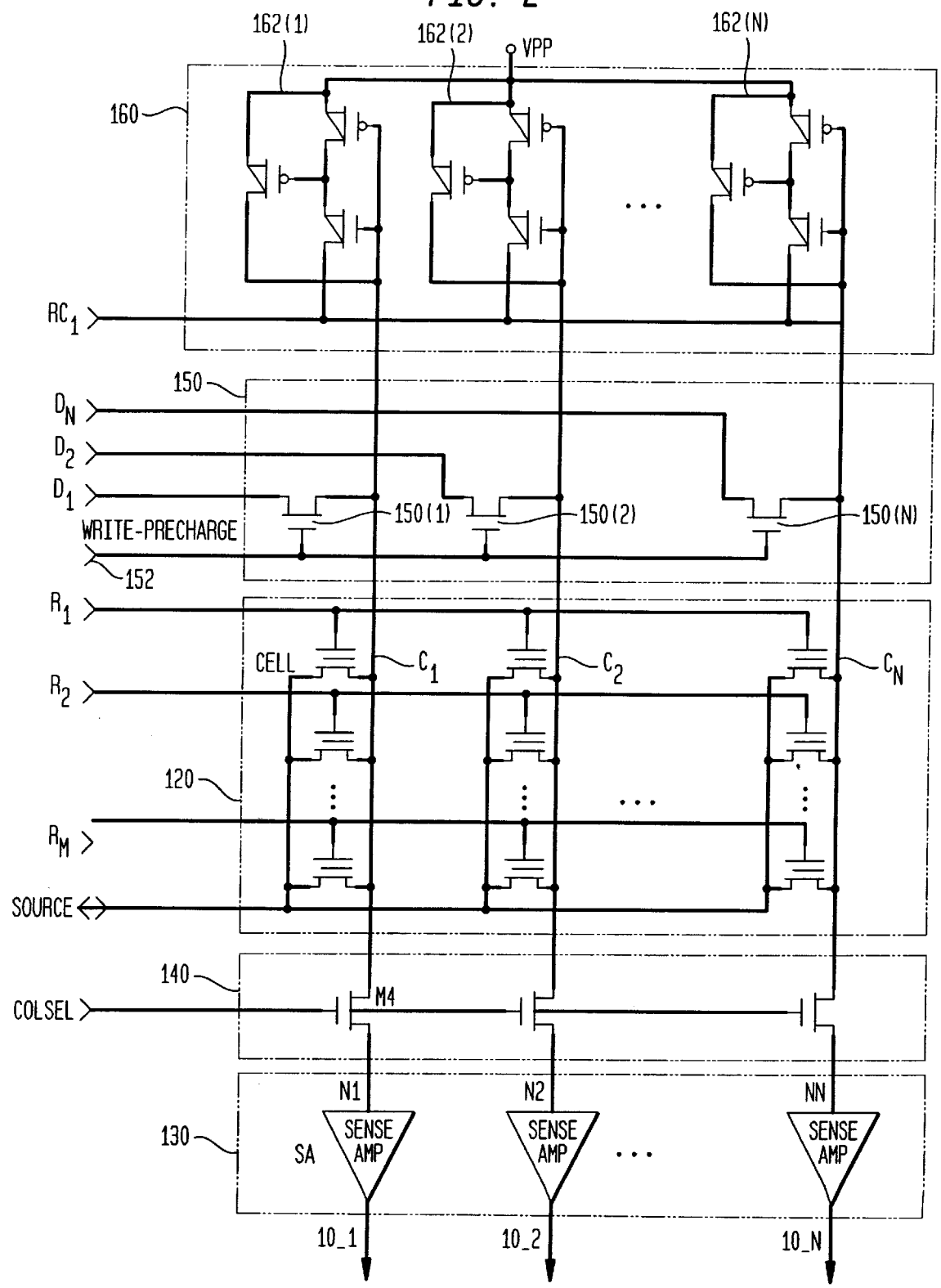
FIG. 2 is a block diagram of an embodiment of a flash EEPROM according to the present invention.
Figure 3:
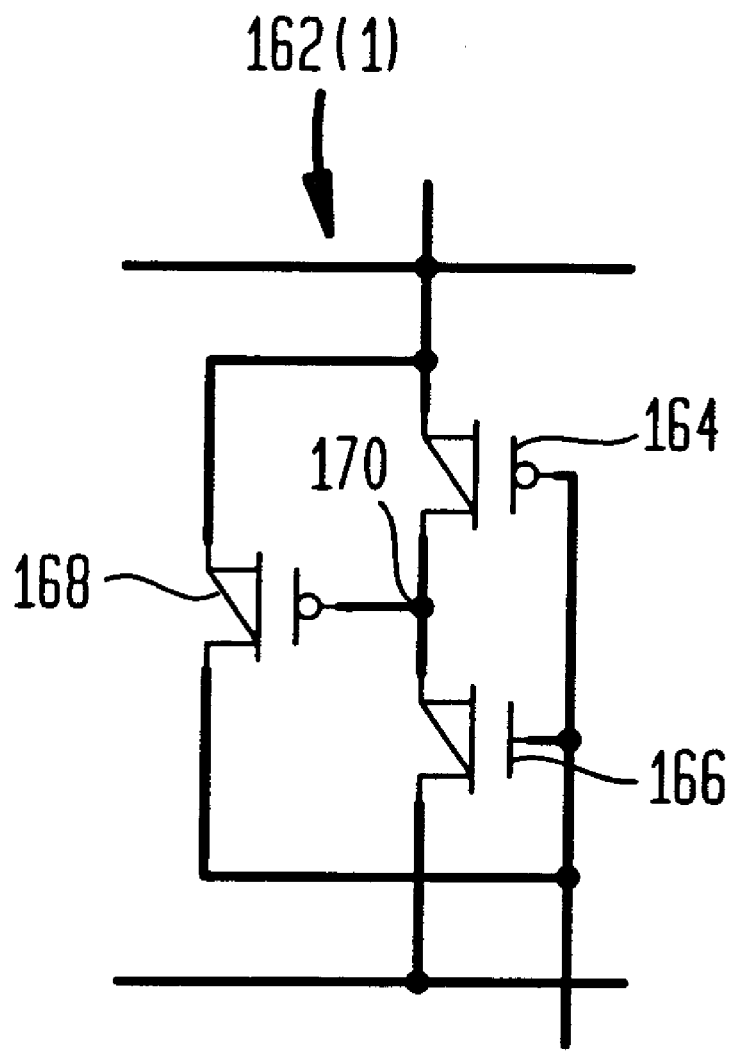
FIG. 3 is a block diagram of a latch according to the embodiment of FIG. 2.

FIG. 2 illustrates a preferred embodiment of a flash EEPROM 100 according to the present invention. As shown in FIG. 2, a flash EEPROM 100 includes a memory array 120 of N columns ($C_1$, $C_2$, . . .$C_N$) and M rows ($R_1$, $R_2$, . . . $R_M$), an on-pitch sense amplifier block 130, and a column select transistor block 140. The on-pitch sense amplifier block 130 and column select transistor block 140 are conventional and do not, in and of themselves, constitute novel subject matter. A precharge and write/erase data transfer block 150 combines the precharge and write/erase data transistor functions using low voltage CMOS transistors 150(1), 150(2) . . . 150(N). A write/erase column boost latch block 160 is situated at the top of the columns and comprises latches 162(1), 162(2), . . . 162(N). As shown in detail in FIG. 3, each latch comprises high voltage transistors 164, 166, and 168, which are interconnected at node 170.

Figure 4:
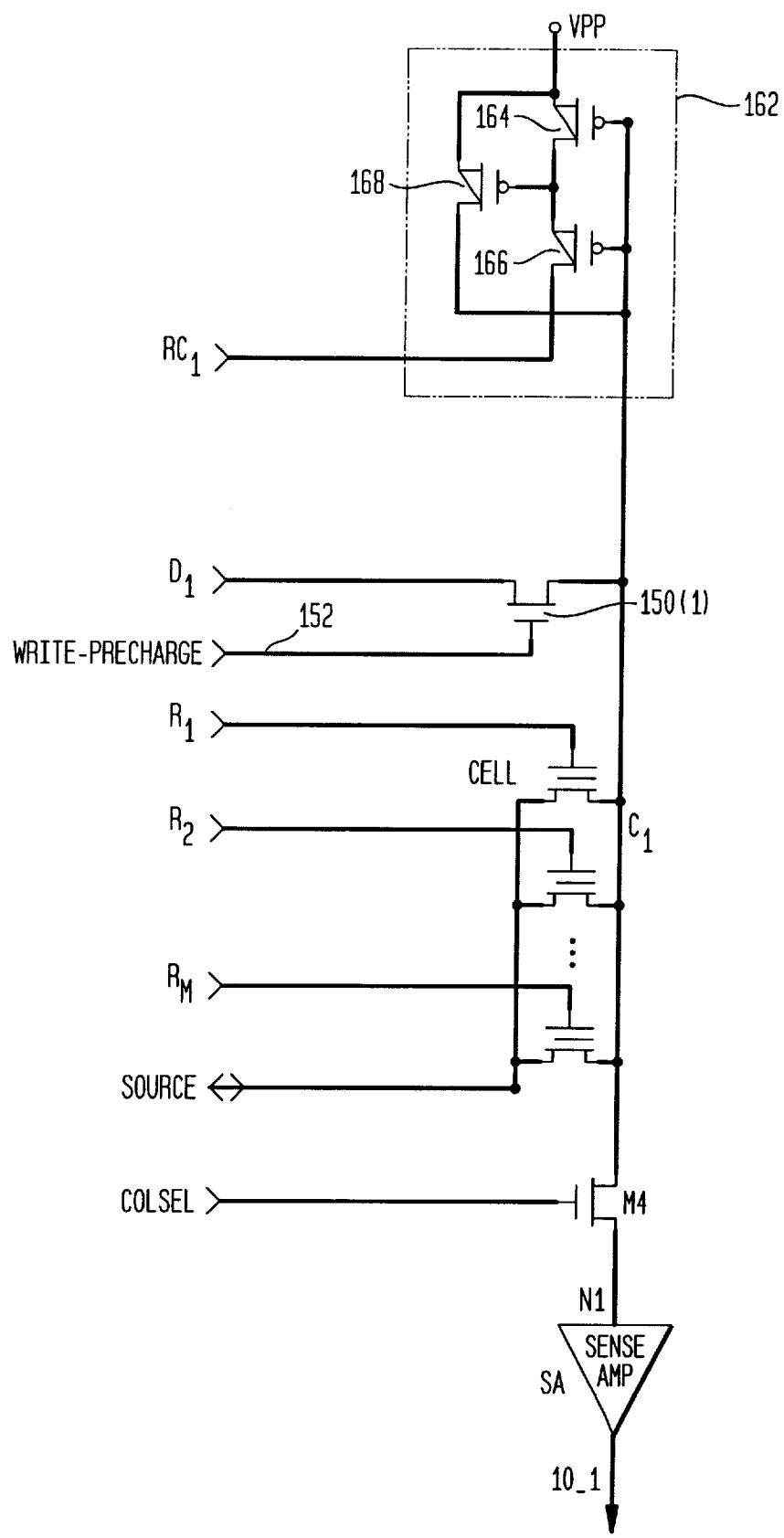
FIG. 4 is a diagram of a single column and associated circuits according to the embodiment of FIG. 2.

As discussed above, in the operation of any flash memory, a memory array is first erased to clear all values stored therein. To do this, one requirement is that all the column voltages must be raised to a high voltage, typically 7 volts. After the memory is erased, selected cells are written. When writing cells along any given row, the columns corresponding to the cells to be written must be raised to high voltage levels, again typically 7 volts. The columns corresponding to cells not to be written must stay at ground potential (0 volts) during the write operation. Following is a description, with reference to FIGS. 3 and 4, of how the flash EEPROM of the present invention raises a column to high voltage levels for write or erase operations and how a non-written column remains at ground during write operation while keeping the read column precharge and write erase data transfer paths at a low voltage level. VDD is the low voltage power supply, typically 3 volts.

To raise a column to high voltage (in this example, 7 volts) during a write or erase operation, the high voltage power supply terminal VPP is initially set equal to the low voltage power supply terminal voltage VDD. Read control input $RC_1$ is set at ground potential, data equal in voltage to VDD is applied to data input $D_1$, and the WRITE-PRECHARGE input 152 is raised to VDD. This sets the voltage on column $C_1$ voltage to VDD−Vt, where Vt is the N-channel threshold voltage of device 150(1). A typical value of Vt is one volt; thus the column will be "raised" to a value of two volts (i.e., 3 volts minus 1 volt equals 2 volts). Within latch 162, transistors 164 and 166 form an inverter that controls whether transistor 168 is on or off. Although both inverter transistors 164 and 166 may be conductive, the gain of transistor 166 is much greater than that of transistor 164 (typically five times greater) so that with two volts on the column $C_1$ and VPP equal to a VDD of 3 volts, the output 170 of the inverter is near ground, turning on pass transistor 168. The conduction of transistor 168 pulls the column to VPP from the interim column voltage of 2 volts, because when the gate of transistor 168 is lowered from its drain potential VPP to below one threshold below its drain potential (VPP−$V_{tp}$), it conducts, thus raising its source (the column) from where it was (2 volts in this example) to its drain potential (VPP). This turns transistor 164 completely off and settles the inverter output 170 at ground potential, At this point, VPP is raised from VDD to the high voltage level, typically 7 volts, required for the write or erase operation. This high voltage is passed through transistor 168 to the column.

At the end of the write or erase operation, it is necessary to return the column to ground potential. This is accomplished by first lowering VPP back down to VDD; this lowers the column to the same level as VDD. Next, the read control input $RC_1$ is raised to VDD level, raising node 170 to an n-channel threshold below VPP. This reduces, but typically not entirely blocks, the conduction of transistor 168. With transistor 168 only weakly conductive, data input $D_1$ is lowered to ground, which discharges the column completely to ground and raises node 170 to VPP (which is now equal to VDD) completely turning off transistor 168. It can be seen that transistor 150(1) must overcome any residual conduction of transistor 168. This is not difficult because transistor 168 is biased in a low gain state due to the gate-to-source voltage on transistor 168 being only a little above its threshold voltage.

As previously mentioned, to inhibit writing or erasing certain columns, it is necessary to be able to keep those columns at ground while writing or erasing other cells on other columns along the active row. To do this, exactly the same procedure is followed as described above when raising a column to high voltage except that the data input corresponding to the columns not to be written is keep at ground potential during the write or erase operation. This holds these columns at ground potential, preventing them from being raised to VDD−Vt. Consequently the output node 170 of the latch inverter is keep at VPP blocking conduction through transistor 168.

During the write and erase operations described above, the VPP supply terminal is first raised from the lower VDD level to the higher voltage VPP and then, at the termination of write or erase, lowered to back to the level of VDD. If VPP is supplied from an off-chip supply, this is accomplished by changing the off-chip voltage supply to the higher voltage VPP. Alternately, VPP can be switched on-chip from VDD to an externally supplied or internally charge pumped high voltage supply. These methods are well known to those skilled in the art.

While not the preferred embodiment, it is also possible to write and erase while keeping VPP fixed at a high voltage at all times. The same procedure described above is followed except that VPP is fixed at the high voltage level. This is not the preferred mode of operation for two reasons. First, after the column has been raised to VDD−Vt, it will be more difficult for the latch inverter, transistors 164 and 166, to lower the output at node 170 because the p-channel transistor 164 is more conductive due to a larger gate-to-source voltage. To overcome this, the gain difference between transistors 164 and 166 is increased, as previously discussed, so that transistor 166 has a much higher gain than transistor 164. Second, during write or erase termination, the column will be lowered from high voltage to ground, instead of from VDD to ground, by transistor 150(1). At this time, $D_1$ is at ground and the drain-to-source potential across transistor 150(1) is the high voltage potential. To prevent punch through and degraded reliability of transistor 150(1), its channel length must be increased. This reduces the gain of transistor 150(1) which, in turn, has the undesirable effect of increasing precharge and cycle time. However, designers may find this embodiment useful for certain applications.

As can be seen, in the present invention the column precharge devices (transistors 150(1), 150(2), . . . 150(N) are high gain, low voltage transistors. This is possible because when high voltage is on the column, the gates of the column precharge transistors 150(1), 150(2), . . . 150(N) are at VDD levels, not at ground as in the prior art. Thus, the oxide stress (drain- and source-to-gate potential) is reduced to the difference between the high voltage level and VDD (e.g., 7 volts−3 volts=4 volts). This reduces the precharge and cycle time and eliminates their lengthening by high voltage transistor degradation.

The write/erase data inputs $D_1$, $D_2$, . . . $D_N$ and read control signal $RC_1$ are at a VDD level when asserted. Thus the circuitry generating these signals does not require the lower reliability, high voltage transistors, leading to greater chip reliability.

While there has been described herein the principles of the invention, it is to be understood by those skilled in the art that this description is made only by way of example and not as a limitation to the scope of the invention. For example, while the preferred embodiment shown in FIG. 2 illustrates a single transistor per column for use as both the write/erase transistor and the column precharge transistor, it is considered to be within the scope of the present invention to use two separate low voltage transistors to separate these functions as shown in FIG. 5. Specifically, as shown in FIG. 5, a separate precharge block 155 can be inserted between latch 160 and a write-erase block 150'. Write-erase block 150' is essentially identical in structure to the precharge and write/erase data transfer block 150 of the embodiment of FIG. 4, but it functions only as a write/erase block. Thus, during precharge the precharge input 157 is "high" (equal to VDD, typically 3 volts), at ground during the non-precharge portion of read, and at VDD during write or erase. During write/erase the write/erase input 152' is high (typically 3 volts) and is otherwise at ground. Further, while the present invention is described with reference to EEPROMs, the principles taught herein may apply generally to all memory devices. It is intended by the appended claims to cover all modifications of the invention which fall within the true spirit and scope of the invention.

I claim:

1. A method of controlling the application of erase and write column voltages to an array of non-volatile memory cells arranged on an integrated circuit having rows and columns, and including a read column precharge path and write/erase data transfer path, comprising the step of:

applying voltage signals to said read column precharge path and said write/erase data transfer path at a level lower than said erase and write column voltages and sufficient to allow the erase and write column voltages to flow along said columns.

2. A method as set forth in claim 1, wherein the level of the voltage signal applied to said read column precharge and write/erase data transfer path is less than 5 volts.

3. A method as set forth in claim 1, wherein the level of the voltage signal applied to said read column precharge and write/erase data transfer path is 3.3 volts or less.

4. A method as set forth in claim 1, wherein said array of non-volatile memory cells comprises an EEPROM.

5. A method as set forth in claim 1, wherein said array of non-volatile memory cells comprises a flash EEPROM.

6. A method of controlling the application of erase and write column voltages to an array of non-volatile memory cells arranged on an integrated circuit having rows and columns, and including a read column precharge path and write/erase data transfer path, and having at least first and second internal power supplies, said first internal power supply supplying erase and write column voltages and said second internal power supply supplying a voltage lower than said erase and write column voltages to said column precharge path and said write/erase data transfer path, comprising the step of:

applying said lower voltage signals from said second power supply to said read column precharge path and said write/erase data transfer path at a level sufficient to allow the erase and write column voltages to flow along said columns.

7. A method as set forth in claim 6, wherein the level of the voltage signal applied to said read column precharge and write/erase data transfer path is less than 5 volts.

8. A method as set forth in claim 6, wherein the level of the voltage signal applied to said read column precharge and write/erase data transfer path is 3.3 volts or less.

9. A method as set forth in claim 6, wherein said array of non-volatile memory cells comprises an EEPROM.

10. A method as set forth in claim 6, wherein said array of non-volatile memory cells comprises a flash EEPROM.

11. A memory device comprising:

a memory array comprising rows and columns;

a precharge and write/erase block coupled to said columns and to said rows, comprising one low-voltage CMOS transistor per column; and a write/erase column latch block coupled to said precharge and write/erase block along said columns.

12. A memory device as set forth in claim 11, wherein said memory device is an EEPROM.

13. A memory device as set forth in claim 12, wherein said EEPROM is a flash EEPROM.

14. A memory device including a memory array having rows and columns, said memory device comprising:

a precharge and write/erase block for controlling the precharge and write/erase functions of said memory device based on a voltage input of less than 5 volts.

15. A memory device as set forth in claim 14, wherein said precharge and write/erase block comprises at least one low-voltage CMOS transistor.

16. A memory device as set forth in claim 14, wherein said memory device comprises an EEPROM.

17. A memory device as set forth in claim 16, wherein said EEPROM is a flash EEPROM.

18. A memory device as set forth in claim 14, further comprising a latch block coupled to said precharge and write/erase block controlling the application of voltage to said columns, said latch comprising:

first and second latch transistors coupled to form an inverter having an output, said second transistor having a gain greater than a gain of said first transistor; and a third latch transistor to form a pass transistor, said third latch transistor having a gate coupled to the output of said inverter, a source coupled to a power supply, and a drain coupled to a column of said memory array.

19. A memory device including a memory array having rows and columns, said memory device comprising:

a latch block for applying erase/write voltage to the column, said latch block coupled to a power supply and coupled to a column and comprising:

first and second latch transistors coupled to form an inverter having an output, and a third latch transistor configured as a pass transistor, having a gate coupled to the output of said inverter, a source coupled to a power supply and a drain coupled to a column of said memory array.

20. A memory device as set forth in claim 19, wherein the voltage applied to the column by said latch block is controlled by the initial voltage on the column.

21. A EEPROM memory device as set forth in claim 19, wherein said memory array comprises an EEPROM.

22. A memory device as set forth in claim 19, wherein said memory array comprises a flash EEPROM.

* * * * *